United States Patent
Yang et al.

(10) Patent No.: US 8,921,206 B2
(45) Date of Patent: Dec. 30, 2014

(54) SEMICONDUCTOR PROCESS

(75) Inventors: Chan-Lon Yang, Taipei (TW); Ching-I Li, Tainan (TW); Ger-Pin Lin, New Taipei (TW); I-Ming Lai, Kaohsiung (TW); Yun-San Huang, New Taipei (TW); Chin-I Liao, Tainan (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 246 days.

(21) Appl. No.: 13/308,513

(22) Filed: Nov. 30, 2011

(65) Prior Publication Data

US 2013/0137243 A1    May 30, 2013

(51) Int. Cl.
*H01L 21/36* (2006.01)

(52) U.S. Cl.
USPC ........... 438/478; 438/482; 438/518; 438/522; 257/E21.09

(58) Field of Classification Search
USPC .................................. 438/478, 482, 518, 522
See application file for complete search history.

(56) References Cited

U.S. PATENT DOCUMENTS

| | | | |
|---|---|---|---|
| 6,855,607 B2 | 2/2005 | Achuthan | |
| 7,013,446 B2 | 3/2006 | Ohba | |
| 7,112,495 B2 | 9/2006 | Ko | |
| 7,250,658 B2 | 7/2007 | Doris | |
| 7,521,324 B2 | 4/2009 | Ohmi | |
| 7,528,392 B2 | 5/2009 | England | |
| 7,531,437 B2 | 5/2009 | Brask | |
| 7,592,270 B2 | 9/2009 | Teo | |
| 7,759,208 B1* | 7/2010 | Frye et al. | 438/303 |
| 2007/0015365 A1 | 1/2007 | Chen | |
| 2007/0072376 A1 | 3/2007 | Chen | |
| 2007/0218661 A1 | 9/2007 | Shroff | |
| 2008/0061366 A1 | 3/2008 | Liu | |
| 2009/0057759 A1 | 3/2009 | Obradovic | |
| 2009/0124097 A1 | 5/2009 | Cheng | |
| 2009/0200494 A1 | 8/2009 | Hatem | |
| 2010/0044783 A1 | 2/2010 | Chuang | |
| 2010/0048027 A1 | 2/2010 | Cheng | |
| 2010/0084583 A1 | 4/2010 | Hatem | |
| 2010/0129994 A1 | 5/2010 | Awad | |
| 2010/0240186 A1* | 9/2010 | Wang | 438/285 |
| 2010/0301394 A1* | 12/2010 | Shimamune et al. | 257/192 |
| 2013/0099314 A1* | 4/2013 | Lu et al. | 257/347 |

OTHER PUBLICATIONS

Renau, "Device performance and yield—A new focus for ion implantation", Varian Semiconductor Equipment Associates, Gloucester, MA 01985, USA, 978-1-4244-5869-1/10, 2010 IEEE, 2010.

(Continued)

*Primary Examiner* — Alexander Ghyka
(74) *Attorney, Agent, or Firm* — Winston Hsu; Scott Margo

(57) ABSTRACT

First, a substrate with a recess is provided in a semiconductor process. Second, an embedded SiGe layer is formed in the substrate. The embedded SiGe layer includes an epitaxial SiGe material which fills up the recess. Then, a pre-amorphization implant (PAI) procedure is carried out on the embedded SiGe layer to form an amorphous region. Next, a source/drain implanting procedure is carried out on the embedded SiGe layer to form a source doping region and a drain doping region. Later, a source/drain annealing procedure is carried out to form a source and a drain in the substrate. At least one of the pre-amorphization implant procedure and the source/drain implanting procedure is carried out in a cryogenic procedure below −30° C.

18 Claims, 8 Drawing Sheets

(56) References Cited

OTHER PUBLICATIONS

Fujii et al., "Sophisticated Methodology of Dummy Pattern Generation for Suppressing Dislocation Induced Contact Misalignment on Flash Lamp Annealed eSiGe Wafer", Semiconductor Company, and R&D Center, Toshiba Corporation, ESS Div., Toshiba Information Systems Corporation, 978-4-86348-009-4, 2009 Symposium on VLSI Technology Digest of Technical Papers, pp. 156-157, 2009.

* cited by examiner

SEMICONDUCTOR PROCESS

BACKGROUND OF THE INVENTION

1. Field of the Invention

The present invention generally relates to a semiconductor process including at least one of an implanting procedure. In particular, the present invention is directed to a semiconductor implanting process carried out in a cryogenic procedure below −30° C. to prevent the epitaxial material from forming dislocations.

2. Description of the Prior Art

Implanting procedures are usually employed in the conventional semiconductor processes to implant the needed dopant. Although the implantation of the dopant comes with the benefits of adjustment of the electrical properties of the semiconductor elements, the damages on the materials coming with the implantation of the dopant usually make the elements more susceptible to unintended effects. In order to solve the dilemma, this technical field thus develops a precise damage engineering. This enhancing amorphization technique enhances the amorphization by implantation to later reduce the residual damage post-anneal. A conventional approach is called a pre-amorphization implant, PAI for short, to form a specific amorphous region on a target material.

However, the pre-amorphization implant method still has some drawbacks. For example, although the pre-amorphization implant method is able to form a specific amorphous region on a target material, the lattice of the target material is also likely to suffer collateral damages, to form dislocations for instance. Dislocation flaws may result in the low junction leakage. Further, in a later rapid thermal step it is possible to encounter the relaxation of the stress in the epitaxial material.

In the light of the above, a novel semiconductor process is still needed. In particular, a novel semiconductor implantation process is still needed to prevent the epitaxial material form dislocation flaws after the pre-amorphization implanting step.

SUMMARY OF THE INVENTION

The present invention proposes multiple possible novel semiconductor processes. The novel semiconductor processes of the present invention include at least one implanting step carried out in a cryogenic procedure. The novel semiconductor processes of the present invention prevent the epitaxial strained material from forming dislocations after the pre-amorphization implanting step although a pre-amorphization implant (PAI) procedure is still included, and prevent problems such as dislocation flaws, low junction leakage or relaxation of the stress so as to further provide a semiconductor element of better device speed and reliability.

The present invention in a first aspect proposes a semiconductor process. First, a substrate with a recess is provided. Second, an embedded semiconductive epitaxial layer is formed in the substrate. The embedded semiconductive epitaxial layer includes an epitaxial semiconductive epitaxial material which fills up the recess. Then, a pre-amorphization implant (PAI) procedure is carried out on the embedded semiconductive epitaxial layer to form an amorphous region. Later, a source/drain implanting procedure is carried out on the embedded semiconductive epitaxial layer to form a source doping region and a drain doping region. Next, a source/drain annealing procedure is carried out to form at the source and drain in the substrate. In particular, at least one of the pre-amorphization implant procedure and the source/drain implanting procedure is carried out in a cryogenic procedure below −30° C.

In one embodiment of the present invention, the embedded semiconductive epitaxial layer includes a plurality of the epitaxial SiGe materials of different concentrations.

In another embodiment of the present invention, the pre-amorphization implant (PAI) procedure is carried out before the source/drain implanting procedure is carried out.

In another embodiment of the present invention, the pre-amorphization implant (PAI) procedure of different depths is carried out in the embedded semiconductive epitaxial layer so that different regions in the embedded semiconductive epitaxial layer are selectively implanted.

In another embodiment of the present invention, an energy of 5 KeV to 30 KeV is used in the pre-amorphization implant (PAI) procedure.

In one embodiment of the present invention, the embedded semiconductive epitaxial layer is free of dislocations after the pre-amorphization implant (PAI) procedure.

The present invention in a second aspect proposes another semiconductor process. First, a substrate with a recess is provided. Second, an embedded semiconductive epitaxial layer is formed in the substrate. The embedded semiconductive epitaxial layer includes an epitaxial SiGe material which fills up the recess. Then, a pre-amorphization implant (PAI) procedure is carried out on the embedded semiconductive epitaxial layer to form an amorphous region. The pre-amorphization implant procedure is carried out in a cryogenic procedure below −30° C. Later, a strained layer is formed to cover the amorphous region. Next, an annealing procedure is carried out to form a stress memory layer which is adjacent to the amorphous region.

In one embodiment of the present invention, the semiconductor process of the present invention may include the following optional step. A source/drain implanting procedure is carried out on the embedded semiconductive epitaxial layer after the pre-amorphization implant (PAI) procedure to form a source doping region and a drain doping region. The source/drain implanting procedure is carried out in a cryogenic procedure below −30° C.

In another embodiment of the present invention, the annealing procedure forms a source and a drain at the same time.

In another embodiment of the present invention, an energy of 5 KeV to 30 KeV is used in the pre-amorphization implant (PAI) procedure.

In another embodiment of the present invention, the embedded semiconductive epitaxial layer is free of dislocations after the pre-amorphization implant (PAI) procedure.

In another embodiment of the present invention, the pre-amorphization implant (PAI) procedure of different depths is carried out in the embedded semiconductive epitaxial layer so that different regions in the embedded semiconductive epitaxial layer are selectively implanted.

The present invention in a third aspect proposes another semiconductor process. First, a substrate with at least one recess is provided. Second, an embedded semiconductive epitaxial layer is formed in the substrate. The embedded semiconductive epitaxial layer includes an epitaxial SiGe material which fills up the recess. Then, a source/drain implanting procedure is carried out on the embedded semiconductive epitaxial layer to form a source doping region and a drain doping region. The source/drain implanting procedure is carried out in a cryogenic procedure below −30° C. Next, a source/drain annealing procedure is carried out to form a source and a drain in the substrate.

In one embodiment of the present invention, the embedded semiconductive epitaxial layer includes a plurality of the epitaxial SiGe materials of different concentrations.

In another embodiment of the present invention, no pre-amorphization implant (PAI) procedure is carried out in the cryogenic procedure.

In another embodiment of the present invention, a dopant in the source/drain implanting procedure on the embedded semiconductive epitaxial layer is selected from a group consisting of boron ions, boron fluoride ions, and boron cluster ions.

These and other objectives of the present invention will no doubt become obvious to those of ordinary skill in the art after reading the following detailed description of the preferred embodiment that is illustrated in the various figures and drawings.

DETAILED DESCRIPTION

The present invention proposes multiple novel semiconductor processes which are carried out in a cryogenic procedure. The novel semiconductor processes of the present invention include at least one implanting step, such as a pre-amorphization implanting step or a source/drain implanting procedure, in a cryogenic condition. The novel semiconductor processes of the present invention prevent the epitaxial material from forming dislocations after the pre-amorphization implanting step, and prevent problems such as dislocation flaws, low junction leakage or relaxation of the stress so as to further provide a semiconductor element of better reliability.

Figure 1:
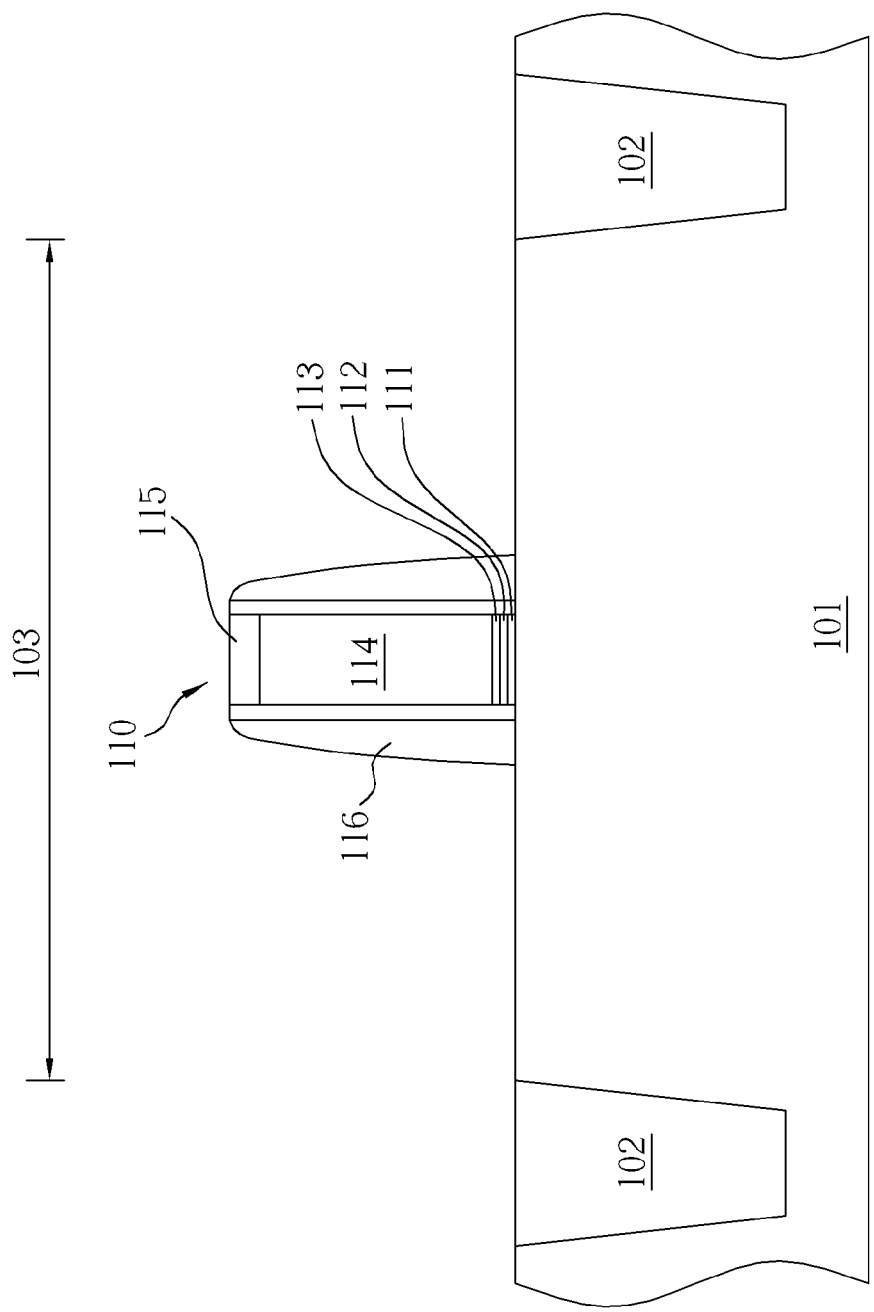
FIGS. 1 to 8 illustrate some exemplary semiconductor processes carried out in a cryogenic procedure of the present invention.

FIGS. 1 to 8 illustrate some semiconductor processes carried out in a cryogenic procedure of the present invention, such as semiconductor processes for fabricating MOS by epitaxial or stress memorization techniques (SMT). First, as shown in FIG. 1, a substrate 101 is provided. The substrate 101 may be a semiconductive material, such as Si. In addition, there may be several shallow trench isolations 102 formed in advance for use as electric segregation. The following steps may be a possible way to form the shallow trench isolations 102. First, a hard mask (not shown) is used to etch the substrate 101 to form several trenches (not shown) for the shallow trench isolations 102. In particular, the region 103 of the substrate 101 may be used as an NMOS or a PMOS, to use embedded SiGe with stress memorization techniques (SMT) for PMOS or to use embedded SiC with stress memorization techniques (SMT) for NMOS to improve the MOS properties. Second, an isolation material (not shown) is used to fill the previously formed trenches (not shown) to obtain the shallow trench isolations 102 after the hard mask (not shown) is removed, planarization is carried out and excess isolation material (not shown) is removed.

Further, a gate structure 110 may be formed on the substrate 101 and a composite structure may be disposed in the bottom of the gate structure 110. For example, the composite structure may include a gate dielectric layer 111, an optional high-k dielectric layer 112 and a barrier layer 113. In the gate structure 110 there are a gate material layer 114 and a hard mask layer 115 to cover the gate material layer 114. The gate structure 110 may further include a first spacer 116 disposed at an inner region and a second spacer (not shown) disposed at an outer region. The gate dielectric layer 111 is in direct contact with the substrate 101 for use as the electric isolation between the gate structure 110 and the substrate 101. If the gate structure 110 is a Si gate, the gate dielectric layer 111 may include a Si compound, such as silicon oxide, silicon nitride, silicon oxynitride or the combination thereof. If the gate structure 110 is a metal gate, the gate dielectric layer 111 may include an oxide, such as silicon oxide. The optional high-k dielectric layer 112 may include a high-k material, such as hafnium oxide ($HfO_2$), hafnium silicon oxide, ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide, ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT), or barium strontium titanate ($Ba_xSr_{1-x}TiO_3$, BST). The barrier layer 113 may serve to segregate the gate material layer 114 and the bottom. The barrier layer 113 may include a metal compound, such as titanium nitride.

Moreover, the gate material layer 114 may be a dummy gate and replaced with a metal material later to form a metal gate (not shown). If so, in the meantime the gate material layer 114 may include an undoped poly-Si. Or, the gate material layer 114 may include a doped poly-Si to form a Si gate. The hard mask layer 115 may be a material including Si.

In addition, before the formation of the first spacer 116, silicon oxide may be optionally formed by thermal oxidation on the sidewall to repair the damages which are formed during the etching of the gate dielectric layer 111, the high-k dielectric layer 112, the barrier layer 113, the gate material layer 114 and the hard mask layer 115 when the gate structure 110 is being formed. The first spacer 116 may be a composite spacer which is formed by firstly depositing different materials of two thin layers then by a following etching. Besides, after the formation of the first spacer 116, an optional lightly drain doping (LDD) implanting step may be carried out.

Figure 2:
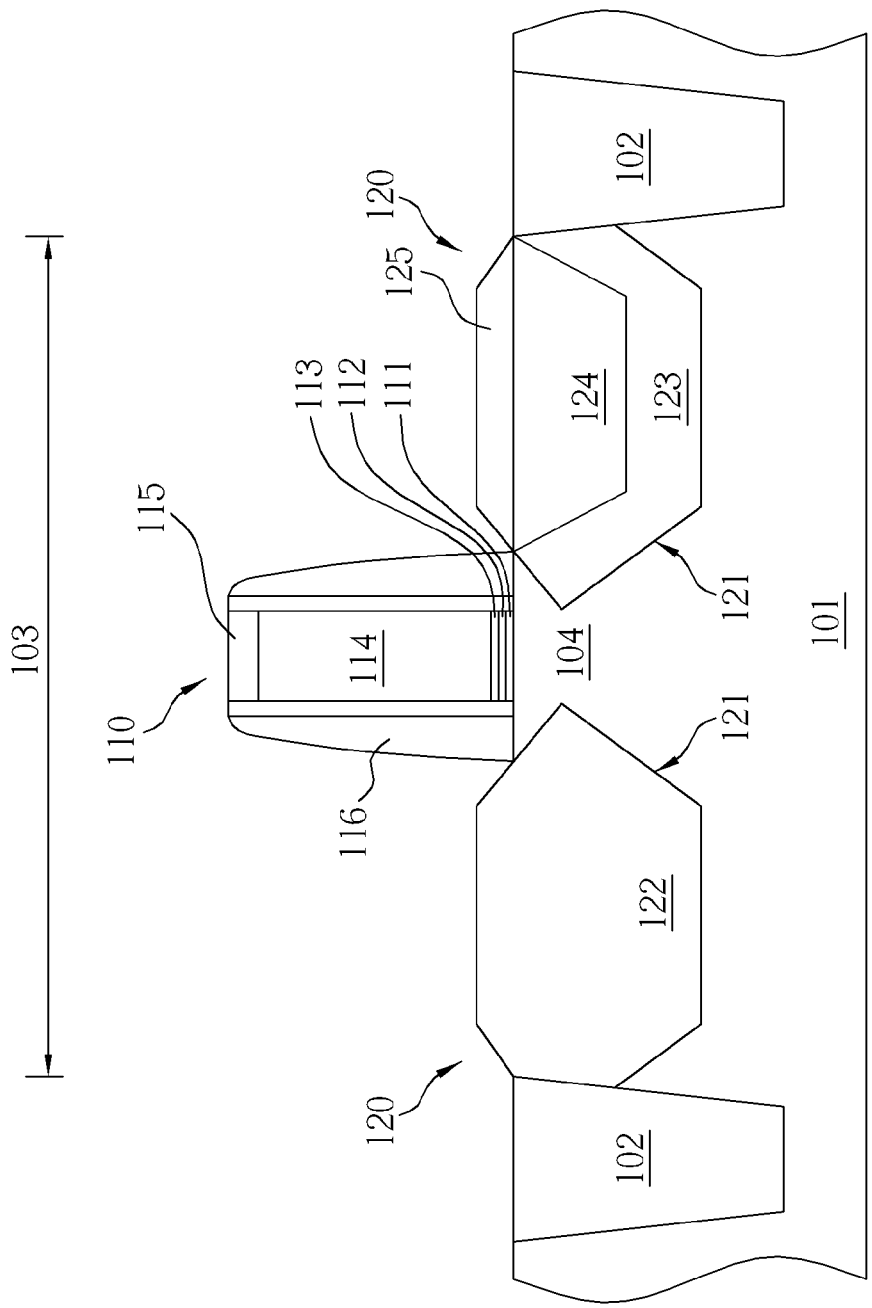

Second, as shown in FIG. 2, an embedded semiconductive epitaxial layer, that is an embedded SiGe layer 120 is formed in the substrate 101. The substrate 101 includes at least a recess 121 and an epitaxial SiGe material 122 fills up the recess 121 to become the embedded SiGe layer 120. The following steps may be a possible way to form the embedded SiGe layer 120. First, the recess 121 is formed by singly or repeatedly etching the exposed substrate 101 in the presence of the shielding of the first spacer 116 and the hard mask layer 115. The recess 121 may have a special shape. For example, the recess 121 may laterally extend to partially occupy the gate channel 104 which is disposed under the gate structure 110. At the same time, the recess 121 disposed under the gate structure 110 may be in a shape of a wedge. Optionally, the recess 121 is obtained in the same etching step for the formation of the first spacer 116.

Next, after a cleaning procedure, an epitaxial material 122 is used to fill up the recess 121 to obtain the embedded SiGe layer 120 by an epitaxial step. Optionally, before the growth of the epitaxial material 122, a hydrogen pre-baking step may be introduced or the growth of the epitaxial material 122 and the hydrogen pre-baking step are carried out in-situ. The epitaxial material 122 usually includes at least two different materials, such as Si, Ge or B serving as a dopant. Further, the embedded SiGe layer 120 may have several sections. For example, a buffer layer 123 which is disposed at the bottom of the recess 121 may include Ge of low concentration, have no boron or a little of B, to reduce the dissimilarity of different lattices with respect to the substrate 101. The bulk layer 124 which is disposed in the middle of the recess 121 may include Ge of high concentration and a lot of B, to mainly serve as the stress source of the gate channel 104. The cap layer 125 may include Ge of low concentration or have no Ge, no boron or a little of B, to cover the bulk layer 124.

Figure 3:
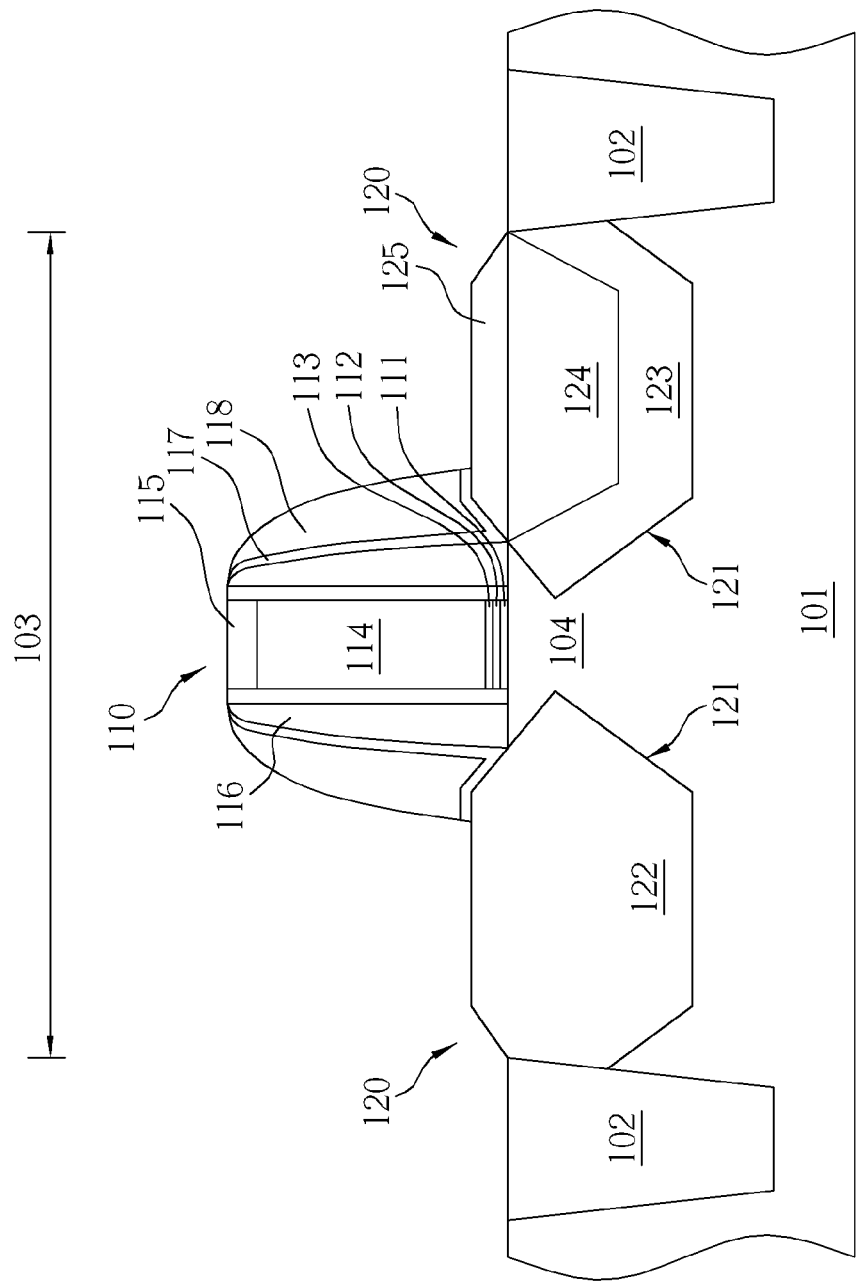

Then, as shown in FIG. 3, a material layer such as silicon oxide (not shown) is used to evenly cover the outside of the first spacer 116 to become a second spacer 117 later. The second spacer 117 may be s single layer or a composite layer. In addition, a silicon nitride layer (not shown) is formed on the second spacer 117 to preferably obtain a second spacer 117 as well as a silicon nitride layer 118 both standing astride the embedded SiGe layer 120 and the epitaxial material 122 by another etching procedure. In this embodiment, the silicon nitride layer 118 may be formed by a Si-containing precursor, such as by. hexachlorosilane (HCD) or a precursor of hexachlorosilane deposited by an atomic layer deposition process (ALD-HCD) but the present invention is not limited to these.

Figure 4:
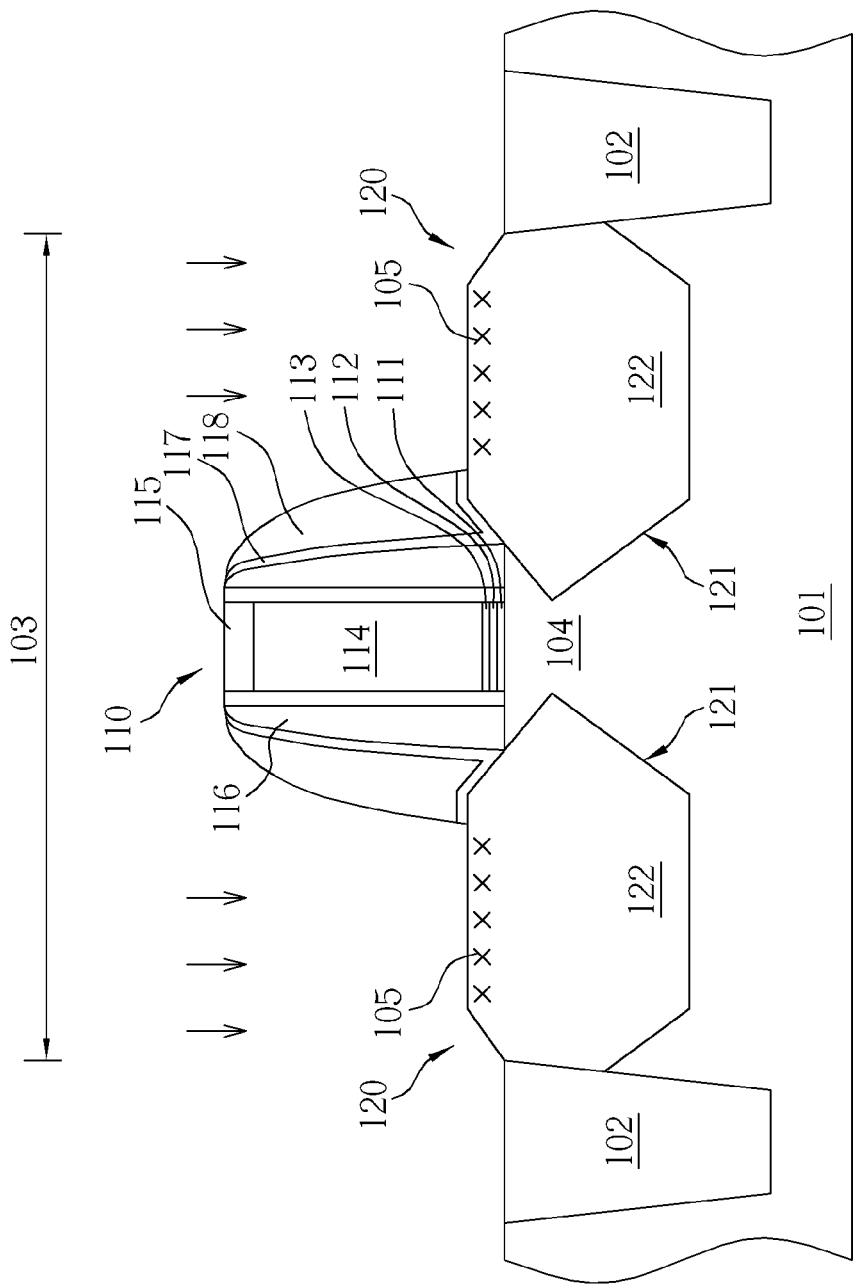

After that, as shown in FIG. 4, a pre-amorphization implant (PAI) procedure is carried out on the embedded SiGe layer 120 to form an amorphous region 105. The pre-amorphization implant (PAI) procedure may be a right angle or an angled PAI procedure to form the amorphous region 105 in the embedded SiGe layer 120 disposed adjacent to the gate structure 110. Please note that the pre-amorphization implant (PAI) procedure may be carried out before or after the steps for the above-mentioned second spacer 117. FIG. 4 illustrates the pre-amorphization implant (PAI) procedure is carried out after the steps for the above-mentioned second spacer 117. Besides, the conventional ion implantation process may form considerable interstitial defects due to the bombardment of the silicon lattice with the dopant.

As described earlier, a conventional pre-amorphization implant (PAI) procedure may partially destroy the epitaxial structure of the embedded SiGe layer 120 to form an amorphous region 105. As a result, one of the technical features of the present invention resides in the cryogenic procedure below −30° C., such as around the boiling point −196° C. of liquid nitrogen, to perform the pre-amorphization implant (PAI) procedure. In such a way, the problems encountered in the current pre-amorphization implant (PAI) procedure may be effectively avoided. For example, after the pre-amorphization implant (PAI) procedure, dopant boron atoms are less likely to penetrate the gate. In one preferred embodiment of the present invention, the pre-amorphization implant (PAI) procedure is carried out to reach different depths in the embedded semiconductive epitaxial layer 120 so that different regions in the embedded semiconductive epitaxial layer 120 are selectively implanted. For example, a shallower implant (PAI) procedure is exclusively carried out on the cap layer 125 which contains no Ge so that the PAI is only done in the cap layer 125. Or alternatively, a deeper implant (PAI) procedure is carried out so that the PAI further penetrates to reach the bulk layer 124. In another embodiment of the present invention, a tetra-valent element, such as C or Si, or Xe or the combination thereof is used to perform the pre-amorphization implant (PAI) procedure. In another embodiment of the present invention, an energy of 5 KeV to 30 KeV is used in the pre-amorphization implant (PAI) procedure in a cryogenic condition to avoid dislocations.

Figure 5:
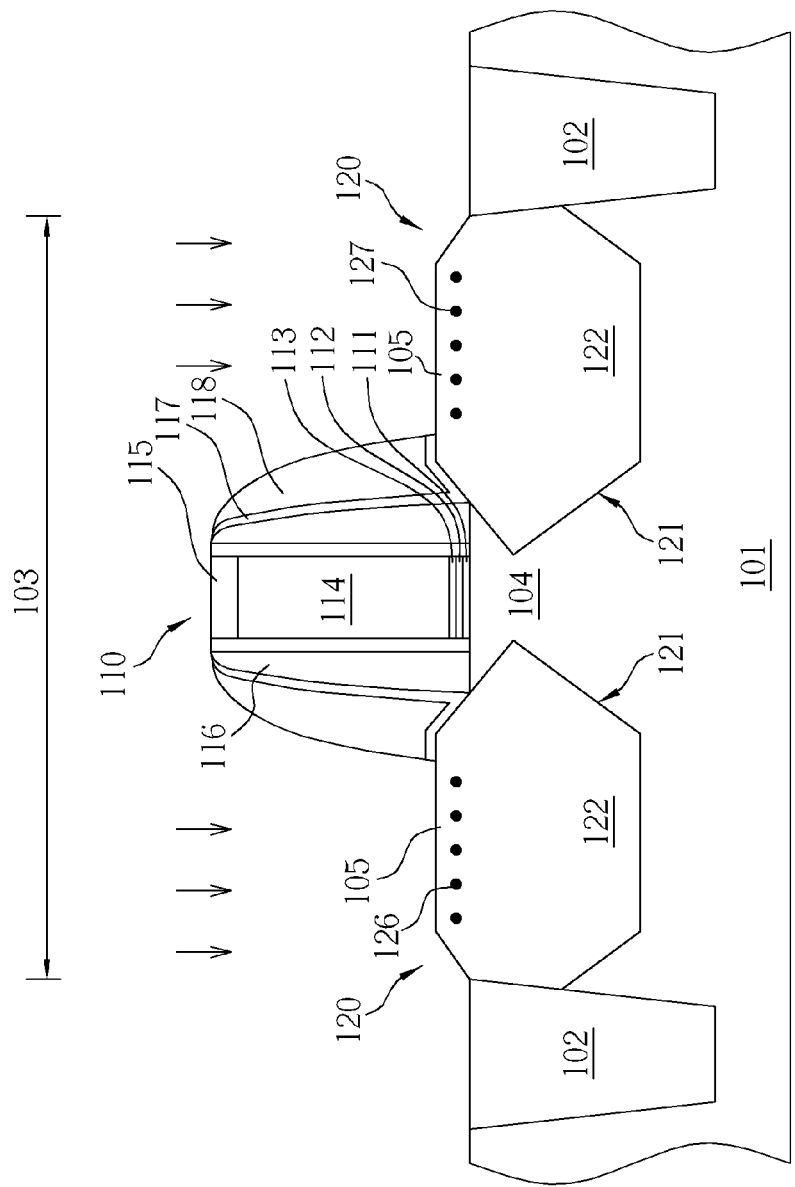

To be continued, as shown in FIG. 5, a source/drain implanting procedure is carried out on the embedded SiGe layer 120 to form a source doping region 126 and a drain doping region 127 together. To be noticed, another technical feature of the present invention resides in the cryogenic procedure below −30° C., such as around the boiling point −196° C. of liquid nitrogen, to perform the source/drain implanting procedure. In such a way, the problems encountered in the current source/drain implanting procedure may be effectively avoided. For example, after the source/drain implanting procedure, dopant boron atoms are less likely to penetrate the gate. The P-type dopant used in the source/drain implanting procedure on the embedded SiGe layer 120 may be boron ions, boron fluoride ions, boron cluster ions or the combination thereof. In one embodiment of the present invention, the pre-amorphization implant (PAI) procedure is carried out before the source/drain implanting procedure is carried out. In another embodiment of the present invention, an energy of 5 KeV to 30 KeV is used in the pre-amorphization implant (PAI) procedure in a cryogenic procedure to avoid dislocations.

Figure 6:
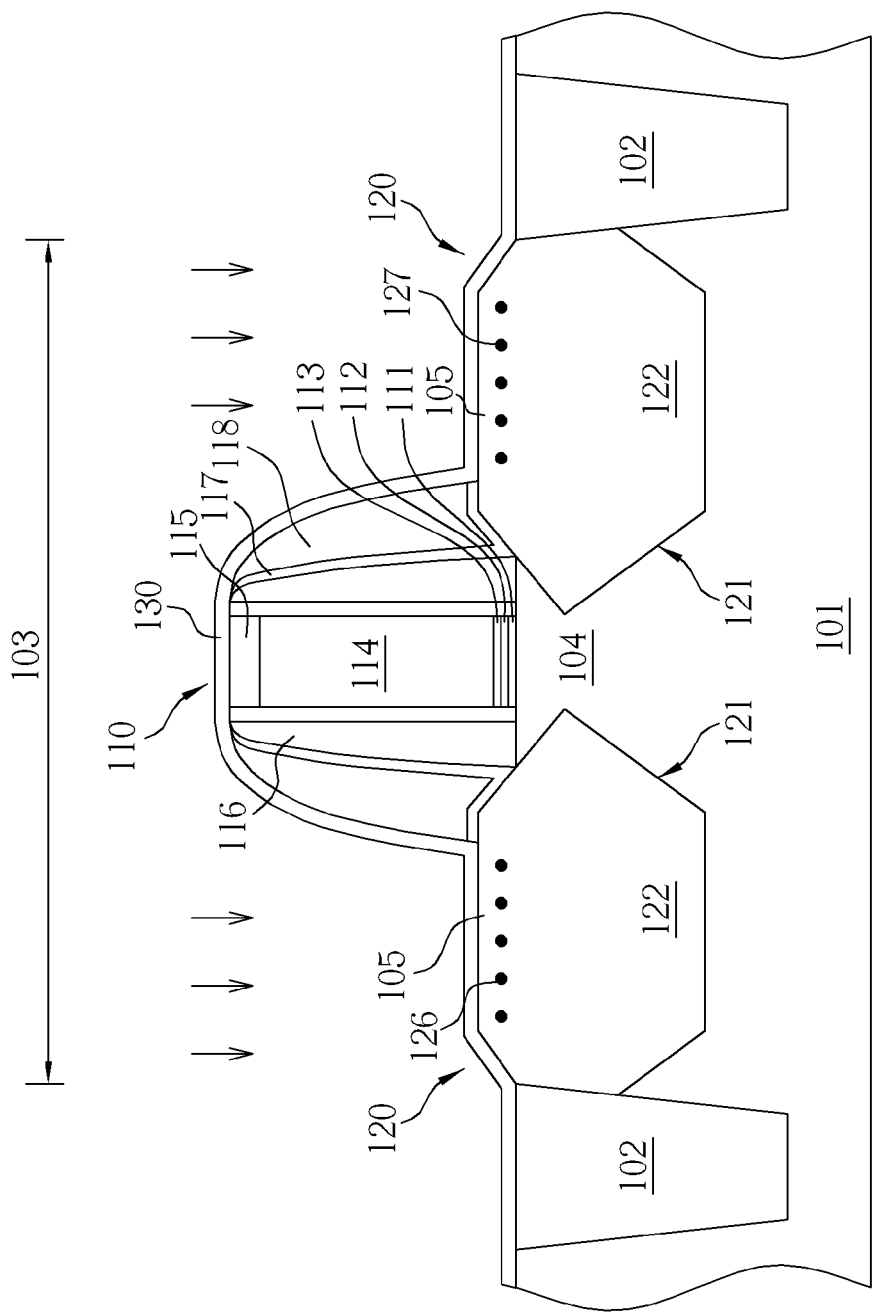

Optionally, as shown in FIG. 6, a stress memory technique (SMT) may be carried out to introduce a stress into the gate channel 104 through the embedded SiGe layer 120 to adjust, for example to increase the carrier mobility in the gate channel 104 after the source/drain implanting procedure. The steps for the stress memory technique (SMT) may be as follows. First, a strained layer 130 is formed to cover the embedded SiGe layer 120, the amorphous region 105 and the gate structure 110. The strained layer 130 may include silicon nitride with a suitable stress. For example, the strained layer 130 may provide one of a compressive stress or a tensile stress.

Figure 7:
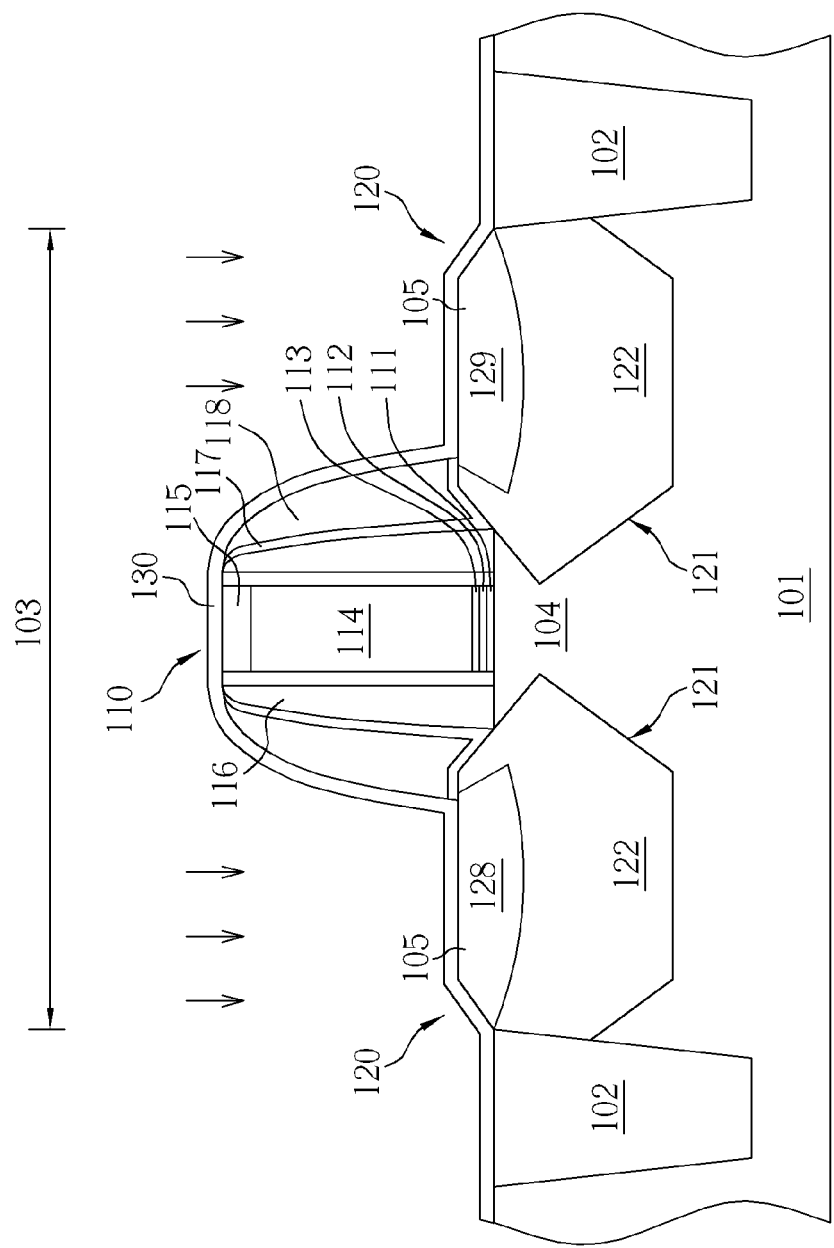
Figure 8:
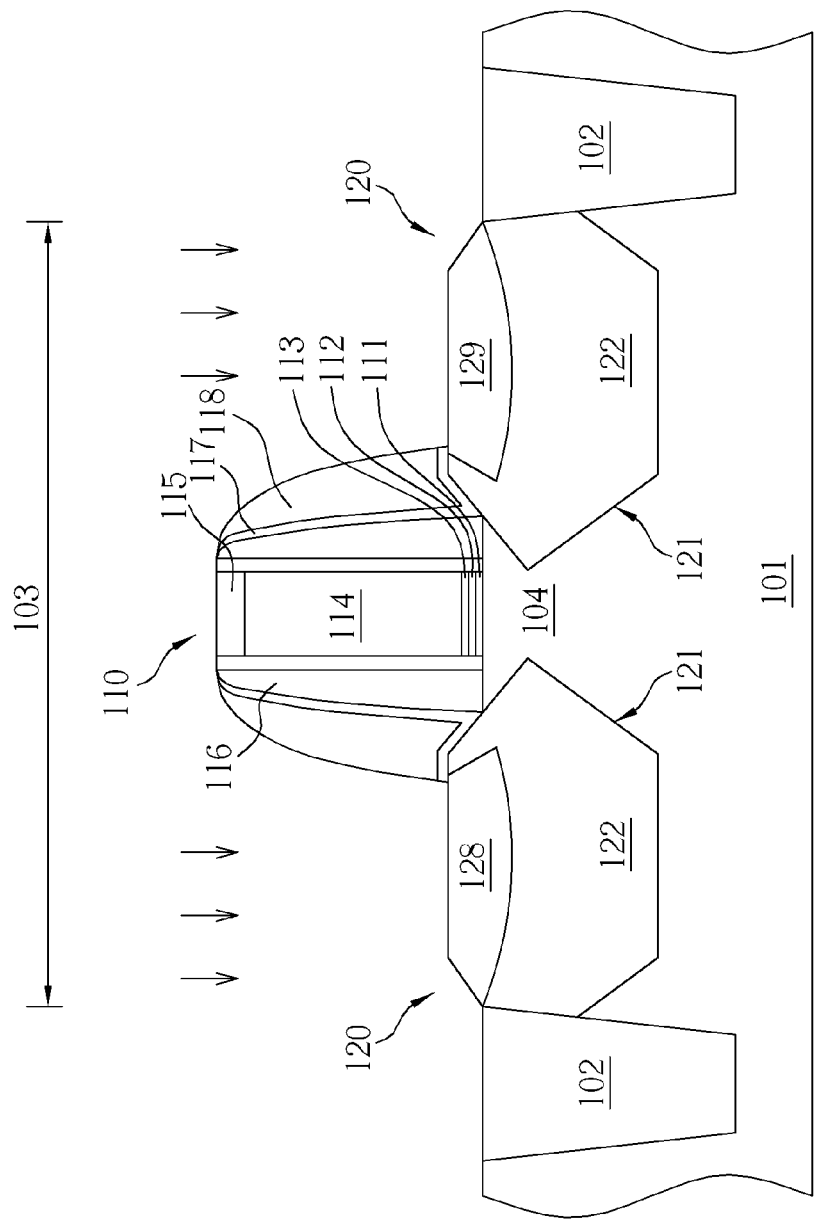

Next, as shown in FIG. 7, an annealing procedure is carried out. Supposing the stress memory technique (SMT) is absent, the annealing procedure may be a conventional source/drain annealing procedure to activate the previously implanted dopant to form a source 128 and a drain 129 together in the substrate 101. Supposing the stress memory technique (SMT) is present, the annealing procedure may be a conventional stress memory annealing procedure to form a stress memory layer adjacent to the amorphous region 105. The stress memory layer possibly includes the embedded SiGe layer 120 as well as the gate channel 104. Please note that the stress memory annealing procedure not only transfers the stress from the strained layer 130 to the embedded SiGe layer 120 as well as to the gate channel 104 but also likely collaterally activates the previously implanted dopant to form a source 128 and a drain 129 together in the substrate 101. After the annealing procedure, the strained layer 130 may be optionally left to serve as an etching-stop layer, as shown in FIG. 7, or alternatively removed, as shown in FIG. 8.

To be followed, other needed semiconductor steps may be carried out, such as to replace the gate material layer 114 with an apt metal material to obtain a metal gate, the formation of silicide, the formation of contact holes, or the formation of contact plugs, etc. The contact plugs (not shown) for the source 127 and the drain 128 may have asymmetric shapes, such as in a rectangular shape for one and in a shape of an extending strip for the other. These necessary steps are well known to persons in the art and the details will not be elaborated here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor process, comprising:
providing a substrate with at least one recess;
forming an embedded semiconductive epitaxial layer comprising an epitaxial SiGe material which fills up said recess in said substrate;

performing a pre-amorphization implant (PAI) procedure on said embedded semiconductive epitaxial layer to form an amorphous region;

after the pre-amorphization implant procedure, performing a source/drain implanting procedure on said embedded semiconductive epitaxial layer to form a source doping region and a drain doping region; and performing a source/drain annealing procedure to form a source and a drain in said substrate, wherein at least one of said pre-amorphization implant procedure and said source/drain implanting procedure is performed in a cryogenic procedure below −30° C.

2. The semiconductor process of claim 1, wherein said embedded semiconductive epitaxial layer comprises a plurality of said epitaxial SiGe materials of different concentrations.

3. The semiconductor process of claim 2, wherein said pre-amorphization implant (PAI) procedure is performed to reach different depths in the embedded semiconductive epitaxial layer so that different regions in said embedded semiconductive epitaxial layer are selectively implanted.

4. The semiconductor process of claim 1, wherein one of a tetra-valent element and Xe is used in said pre-amorphization implant (PAI) procedure.

5. The semiconductor process of claim 1, wherein an energy of 5KeV to 30 KeV is used in said pre-amorphization implant (PAI) procedure.

6. The semiconductor process of claim 1, wherein said embedded semiconductive epitaxial layer is free of dislocations after said pre-amorphization implant (PAI) procedure.

7. A semiconductor process, comprising:
providing a substrate with at least one recess;
forming an embedded semiconductive epitaxial layer comprising an epitaxial SiGe material which fills up said recess in said substrate, wherein said epitaxial SiGe material comprises a bulk layer in the middle of the recess and a cap layer covering said bulk layer, and said bulk layer has concentration of Ge of higher than said cap layer has;
performing a pre-amorphization implant (PAI) procedure on said embedded semiconductive epitaxial layer to form an amorphous region, wherein said pre-amorphization implant procedure is performed in a cryogenic procedure below −30° C., and said pre-amorphization implant (PAI) procedure is performed to reach different depths in said embedded semiconductive epitaxial layer so that different regions in said embedded semiconductive epitaxial layer are selectively implanted;
forming a strained layer to cover said amorphous region; and
performing an annealing procedure to form a stress memory layer adjacent to said amorphous region.

8. The semiconductor process of claim 7, further comprising:
performing a source/drain implanting procedure on said embedded semiconductive epitaxial layer after said pre-amorphization implant (PAI) procedure to form a source doping region and a drain doping region, wherein said source/drain implanting procedure is performed in a cryogenic procedure below −30° C.

9. The semiconductor process of claim 8, wherein said annealing procedure forms a source and a drain at the same time.

10. The semiconductor process of claim 7, further comprising:
removing said strained layer after said annealing procedure.

11. The semiconductor process of claim 7, wherein one of a tetra-valent element and Xe is used in said pre-amorphization implant (PAI) procedure.

12. The semiconductor process of claim 7, wherein an energy of 5KeV to 30 KeV is used in said pre-amorphization implant (PAI) procedure.

13. The semiconductor process of claim 7, wherein said embedded semiconductive epitaxial layer is free of dislocations after said pre-amorphization implant (PAI) procedure.

14. The semiconductor process of claim 7, wherein said pre-amorphization implant (PAI) procedure is performed to reach different depths in the embedded semiconductive epitaxial layer so that different regions in said embedded semiconductive epitaxial layer are selectively implanted.

15. A semiconductor process, comprising:
providing a substrate with at least one recess;
forming an embedded semiconductive epitaxial layer comprising an epitaxial SiGe material which fills up said recess in said substrate;
performing a pre-amorphization implant (PAI) procedure on said embedded semiconductive epitaxial layer to form an amorphous region wherein said pre-amorphization implant (PAI) procedure is performed in a cryogenic procedure below −30° C.;
performing a source/drain implanting procedure on said embedded semiconductive epitaxial layer to form a source doping region and a drain doping region, wherein said source/drain implanting procedure is performed in a cryogenic procedure below −30° C.; and
performing a source/drain annealing procedure to form a source and a drain in said substrate.

16. The semiconductor process of claim 15, wherein said embedded semiconductive epitaxial layer comprises a plurality of said epitaxial SiGe materials of different concentrations.

17. The semiconductor process of claim 15, wherein no pre-amorphization implant (PAI) procedure is performed in said cryogenic procedure.

18. The semiconductor process of claim 15, wherein a dopant in said source/drain implanting procedure on said embedded semiconductive epitaxial layer is selected from a group consisting of boron ions, boron fluoride ions, and boron cluster ions.

* * * * *